(12) United States Patent
Tsutsumi et al.

(10) Patent No.: US 12,015,396 B2
(45) Date of Patent: Jun. 18, 2024

(54) ELECTRONIC SYSTEM AND METHOD

(71) Applicant: KABUSHIKI KAISHA TOSHIBA, Tokyo (JP)

(72) Inventors: Yukako Tsutsumi, Kawasaki Kanagawa (JP); Koji Akita, Yokohama Kanagawa (JP); Hiroyuki Kitagawa, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 947 days.

(21) Appl. No.: 17/021,278

(22) Filed: Sep. 15, 2020

(65) Prior Publication Data
US 2021/0273639 A1 Sep. 2, 2021

(30) Foreign Application Priority Data
Feb. 28, 2020 (JP) ................. 2020-034154

(51) Int. Cl.
*H04W 56/00* (2009.01)
*H03K 17/30* (2006.01)
*H03M 9/00* (2006.01)
*H02P 7/29* (2016.01)

(52) U.S. Cl.
CPC .............. *H03K 17/30* (2013.01); *H03M 9/00* (2013.01); *H04W 56/001* (2013.01); *H02P 7/29* (2013.01)

(58) Field of Classification Search
CPC ............. H04L 25/4917; H04L 25/4904; H04L 25/4908; H04L 25/0272; H04L 1/0045; H04L 1/0057; H04L 7/033; H04L 25/4919; H04J 3/0685; H04J 2203/0091; H04J 3/0623; H04J 3/0691; H04J 3/1611; H04J 3/0629; H04J 1/00; H04J 14/06; H04J 3/00; H04B 7/26
USPC ......................................... 375/220
See application file for complete search history.

(56) References Cited

U.S. PATENT DOCUMENTS

| | | | | |
|---|---|---|---|---|
| 2013/0329828 | A1* | 12/2013 | Lee | H04B 7/015 375/296 |
| 2015/0117580 | A1* | 4/2015 | Lee | H04L 25/4904 375/360 |
| 2015/0351057 | A1 | 12/2015 | Akita et al. | |
| 2017/0019275 | A1* | 1/2017 | Norimatsu | H04B 3/08 |
| 2018/0167876 | A1* | 6/2018 | McFarthing | H04L 25/03273 |

(Continued)

FOREIGN PATENT DOCUMENTS

| | | |
|---|---|---|
| JP | 2012060793 A | 3/2012 |
| JP | 2015226214 A | 12/2015 |

(Continued)

*Primary Examiner* — Eva Y Puente
(74) *Attorney, Agent, or Firm* — Holtz, Holtz & Volek PC

(57) ABSTRACT

According to one embodiment, in electronic apparatus, controller generates first and second control signals to control first and second controlled unit. First serial converter multiplexes the first and second control signals into first serial signal. First wireless transmitter transmits the first serial signal by first wireless signal in a chronologically continuous manner. First wireless receiver receives the first wireless signal. First parallel converter separates the first and second control signals from the first wireless signal received by first wireless receiver, to output the first control signal to first controlled unit, and to output the second control signal to second controlled unit.

12 Claims, 9 Drawing Sheets

(56) References Cited

U.S. PATENT DOCUMENTS

2019/0207742 A1    7/2019   Haroun et al.
2019/0312537 A1   10/2019   Samuel et al.

FOREIGN PATENT DOCUMENTS

| JP | 2016149709 A | 8/2016 |
|---|---|---|
| JP | 2019536417 A | 12/2019 |

\* cited by examiner

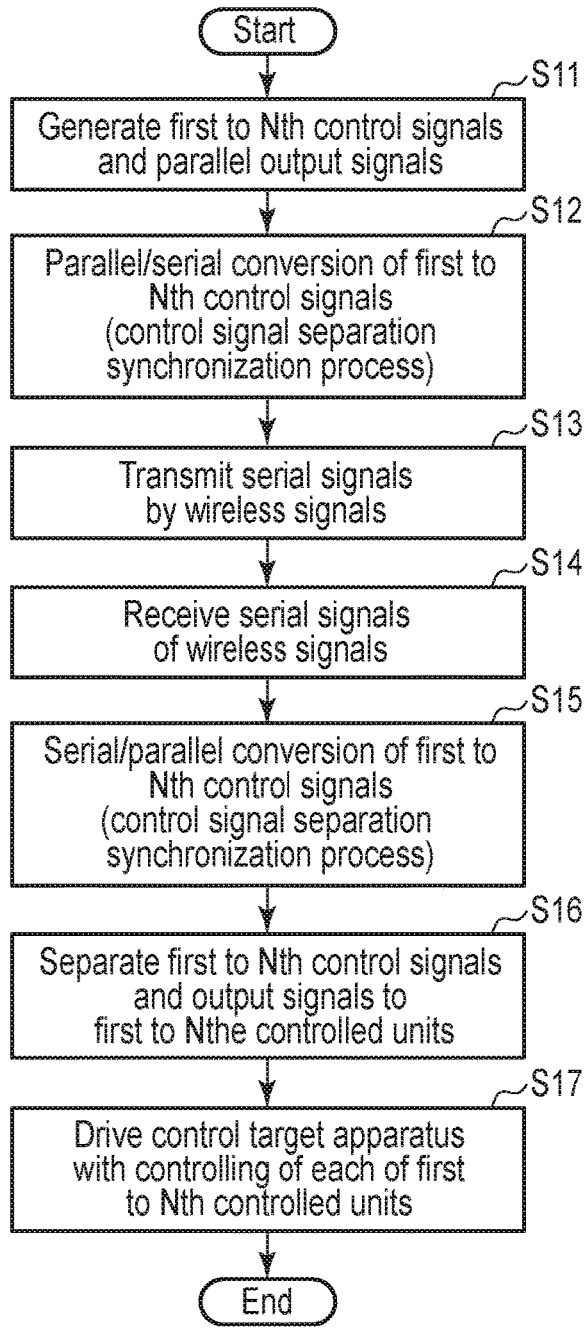
F I G. 2A
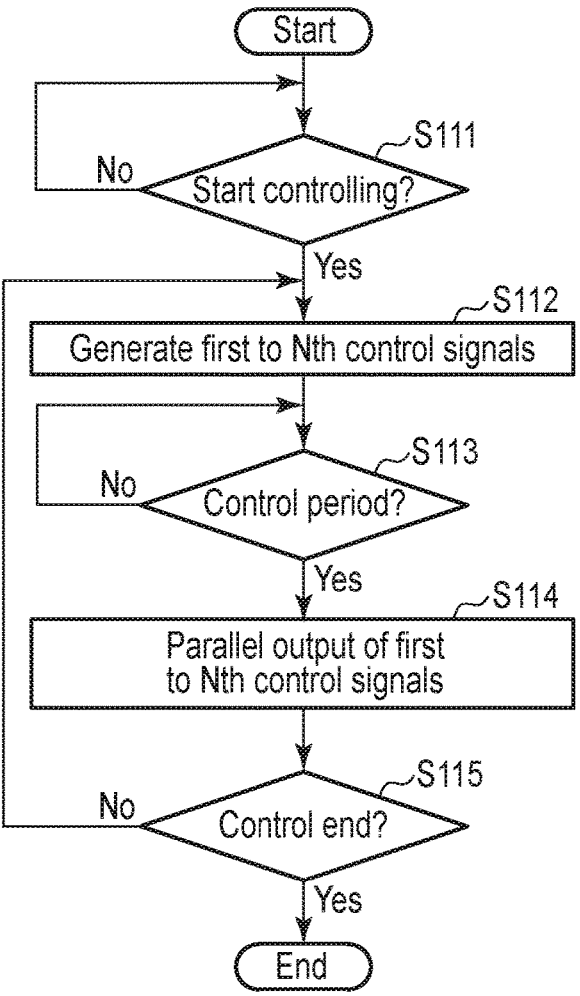
F I G. 2B

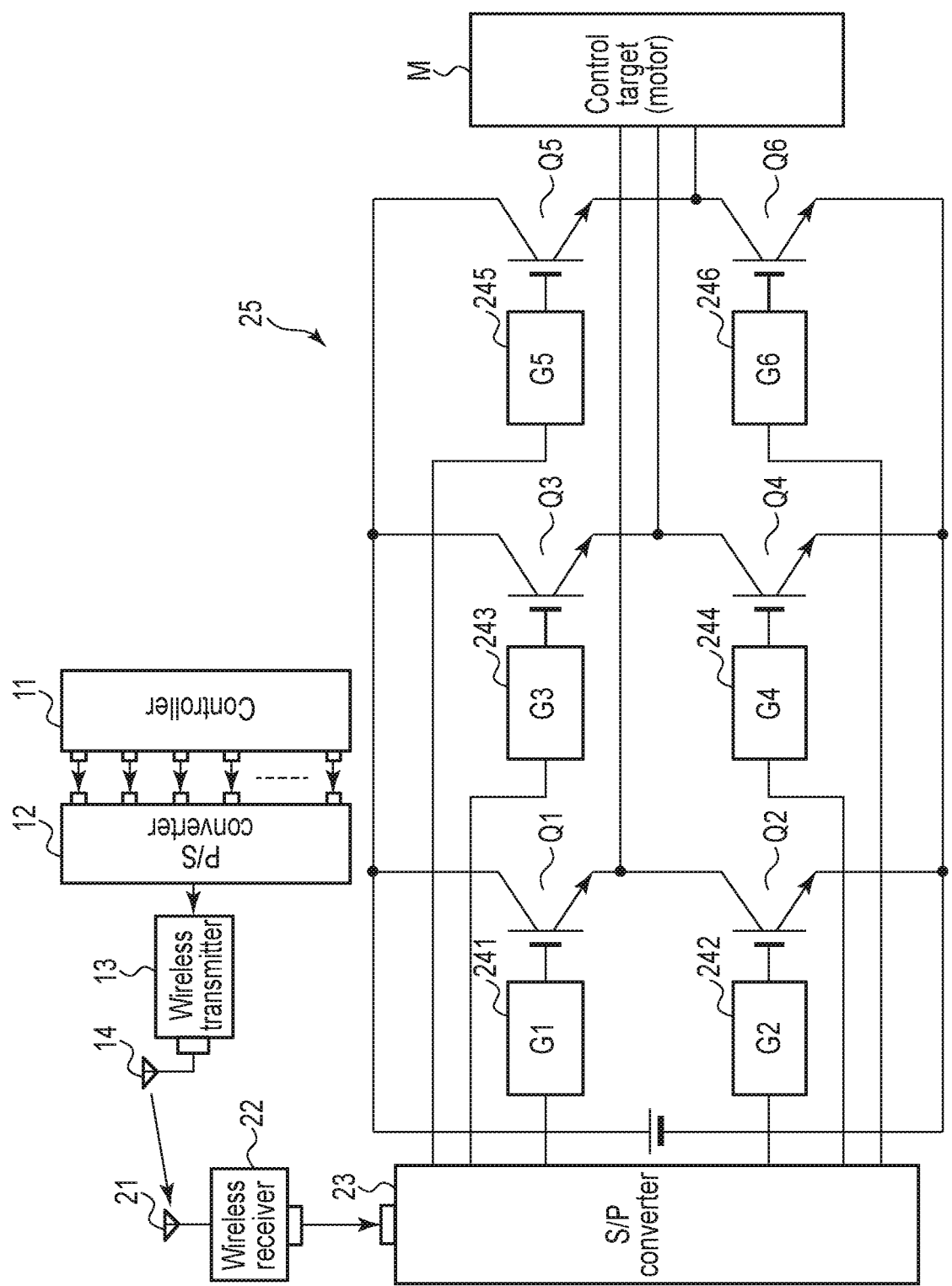
F I G. 4

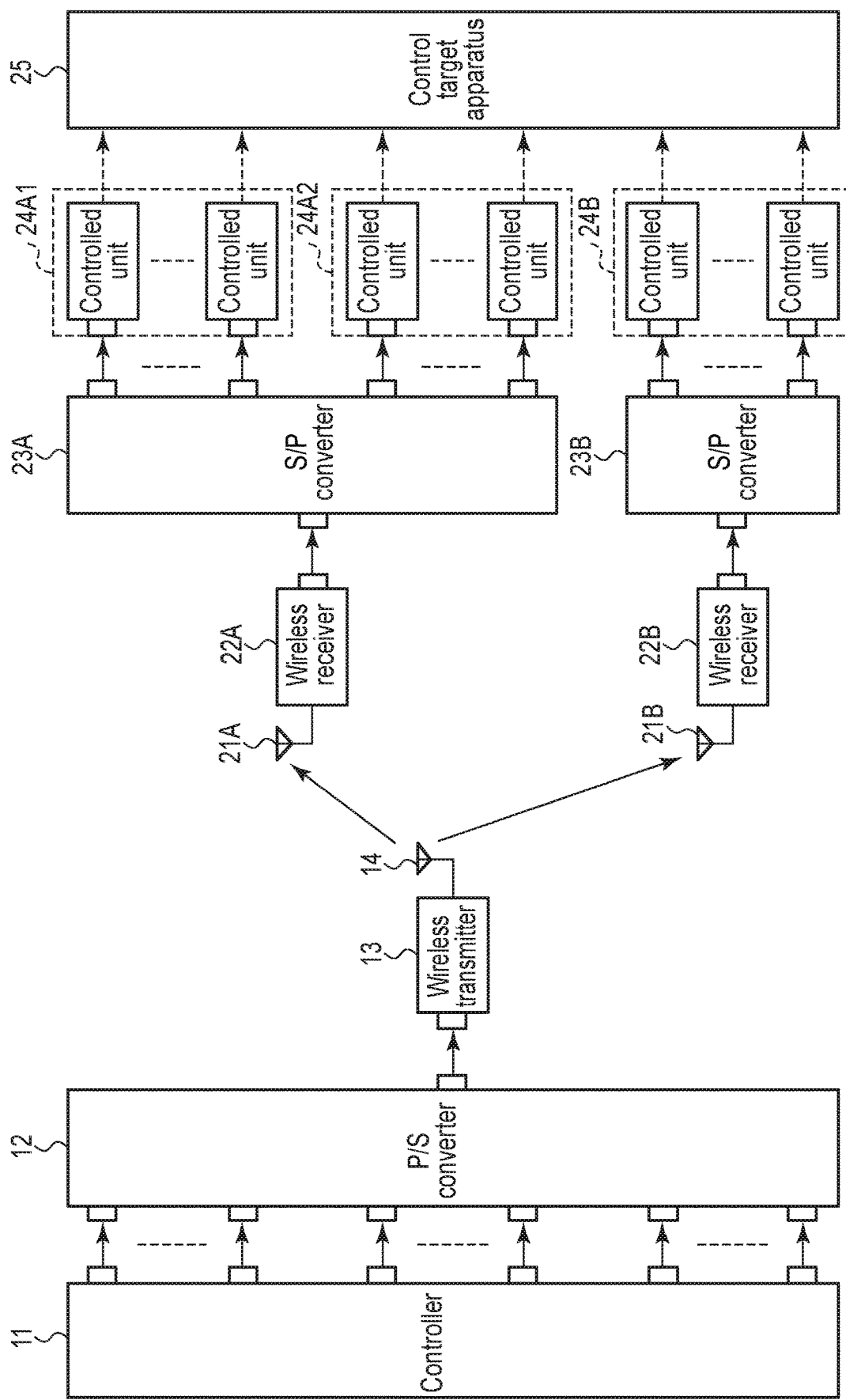
F I G. 5

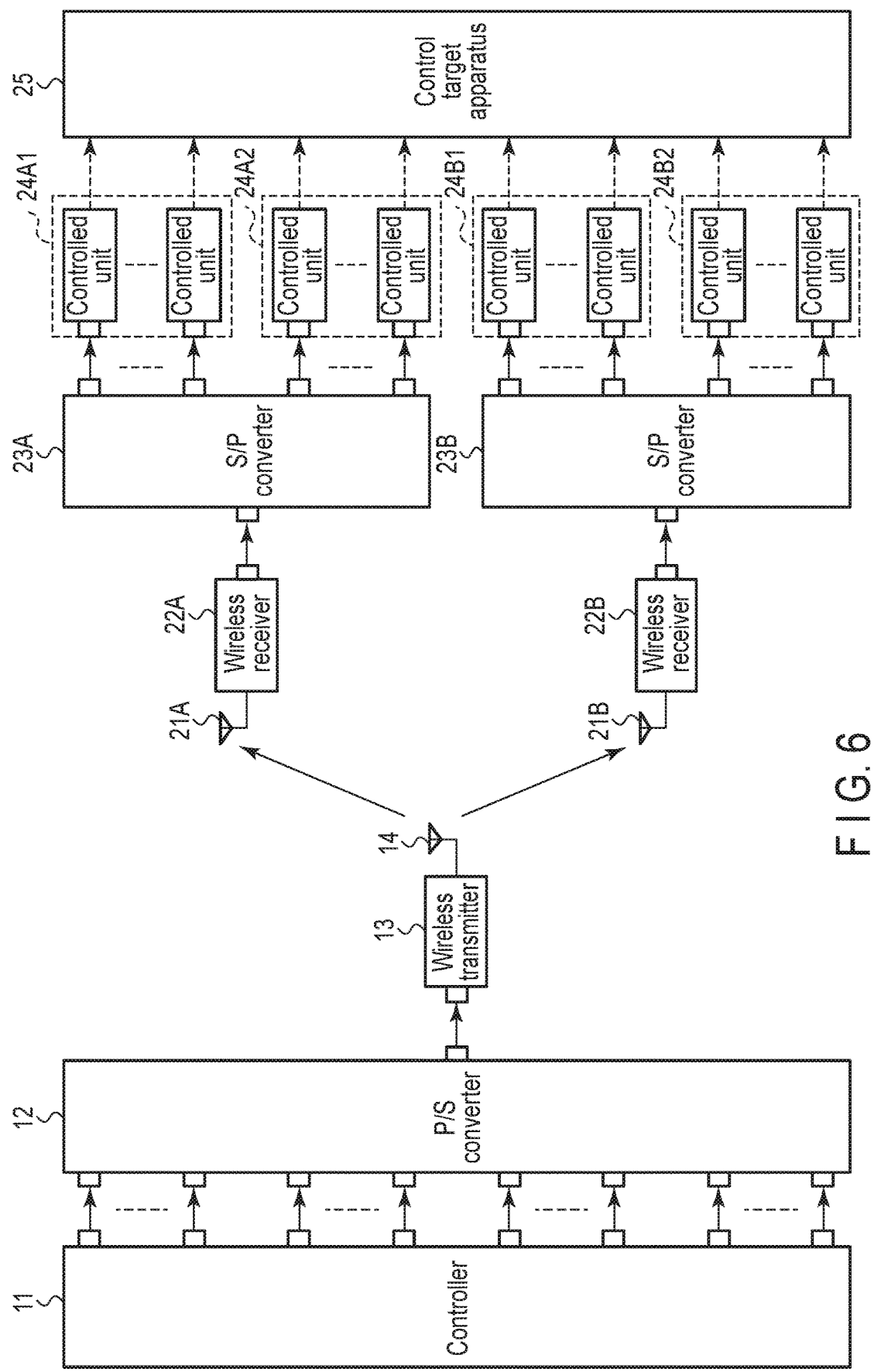
F I G. 6

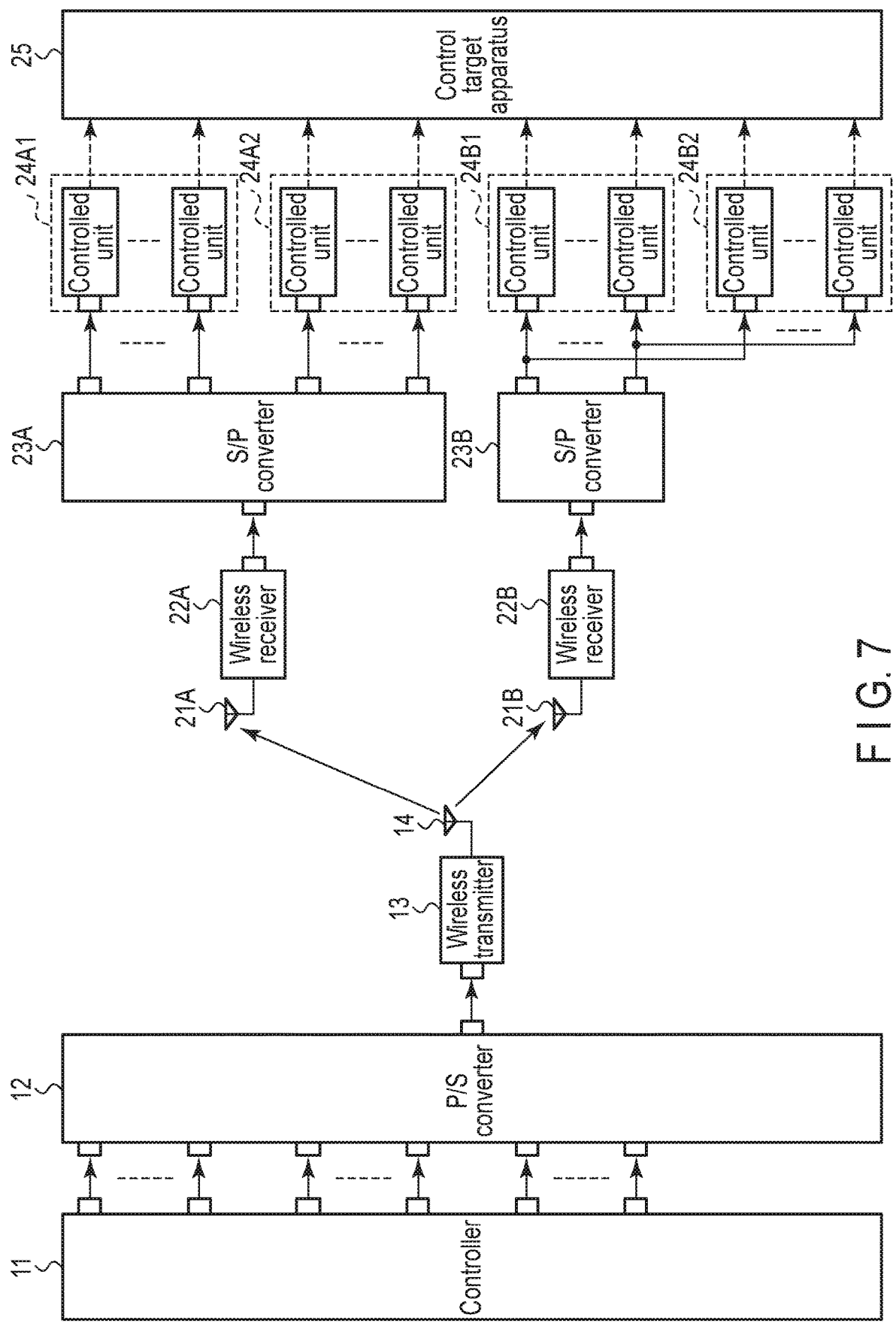
F I G. 7

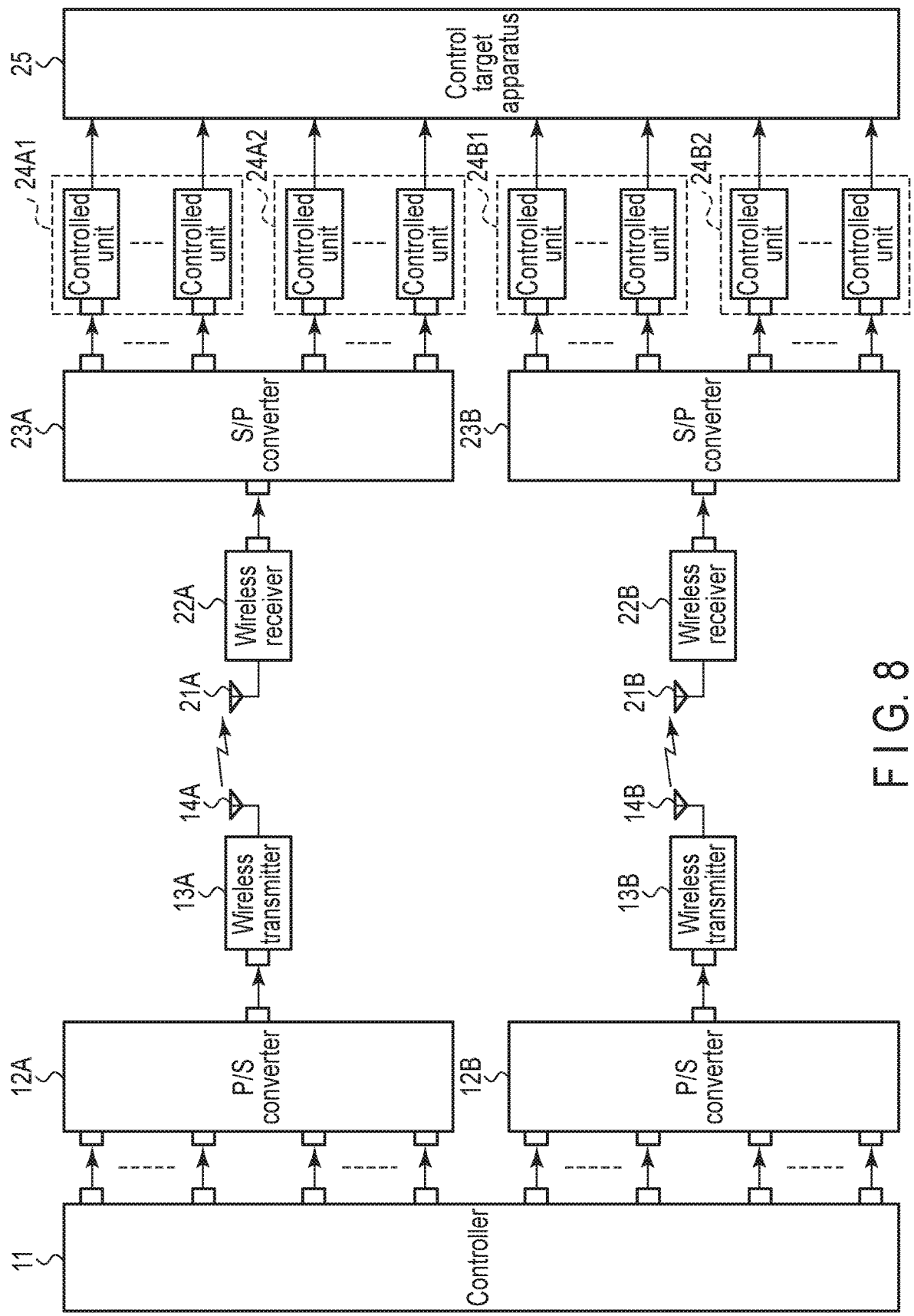
F I G. 8

ELECTRONIC SYSTEM AND METHOD

CROSS-REFERENCE TO RELATED APPLICATIONS

This application is based upon and claims the benefit of priority from Japanese Patent Application No. 2020-034154, filed Feb. 28, 2020, the entire contents of which are incorporated herein by reference.

FIELD

Embodiments described herein relate generally to an electronic system and a method.

BACKGROUND

In order to utilize an electronic system, there is a proposed technique to individually drive control by wireless of one or more variable frequency drives (VFD) each configured to generate a pulse width modification (PWM) signal to drive a motor, for example. In that case, in general, multiple drive signals used to switch power transistors in one VFD are packetized and transmitted by wireless, received by one receiver, and output to a gate drive of each power transistor.

However, through the above method, there are several times when the packets reach the destination, and thus, there will be shifting between the switching times in the controlling by packet transmitting of the drive signal of each of the gates to be synchronized, and the operation cannot be performed properly.

Especially, in the packet transmitting, when the frame is shortened to decrease the delay, the transmitting rate decreases, and when the frame is elongated to maintain the transmitting rate, the delay increases. Thus, there is a problem that both low delay and high transmitting rate are difficult to achieve at the same time.

As mentioned above, in an electronic system using a conventional packet transmitting, control signals are packet transmitted, and distributed to each control target in the receiver side, and thus, there is shifting between the control timings, and the operation cannot be performed properly. Furthermore, low delay and high transmitting rate cannot be achieved at the same time.

BRIEF DESCRIPTION OF THE DRAWINGS

FIG. 2A and FIG. 2B are flowcharts of a process of the electronic system of the first embodiment.

FIG. 4 is a block diagram of the structure of the electronic system of the first embodiment, in which a motor-driven apparatus is implemented as a control target apparatus.

FIG. 5 is a block diagram of the structure of an electronic system of a second embodiment.

FIG. 6 is a block diagram of the structure of an electronic system of a third embodiment.

FIG. 7 is a block diagram of the structure of an electronic system of a fourth embodiment.

FIG. 8 is a block diagram of the structure of an electronic system of a fifth embodiment.

DETAILED DESCRIPTION

In general, according to one embodiment, an electronic system includes: a controller configured to generate a first control signal to control a first controlled unit and a second control signal to control a second controlled unit; a first serial converter configured to multiplex the first control signal and the second control signal into a first serial signal; a first wireless transmitter configured to transmit the first serial signal by a first wireless signal in a chronologically continuous manner; a first wireless receiver configured to receive the first wireless signal; and a first parallel converter configured to separate the first control signal and the second control signal from the first wireless signal received by the first wireless receiver, to output the first control signal to the first controlled unit, and to output the second control signal to the second controlled unit.

Various embodiments will be described hereinafter with reference to the accompanying drawings.

First Embodiment

Figure 1:
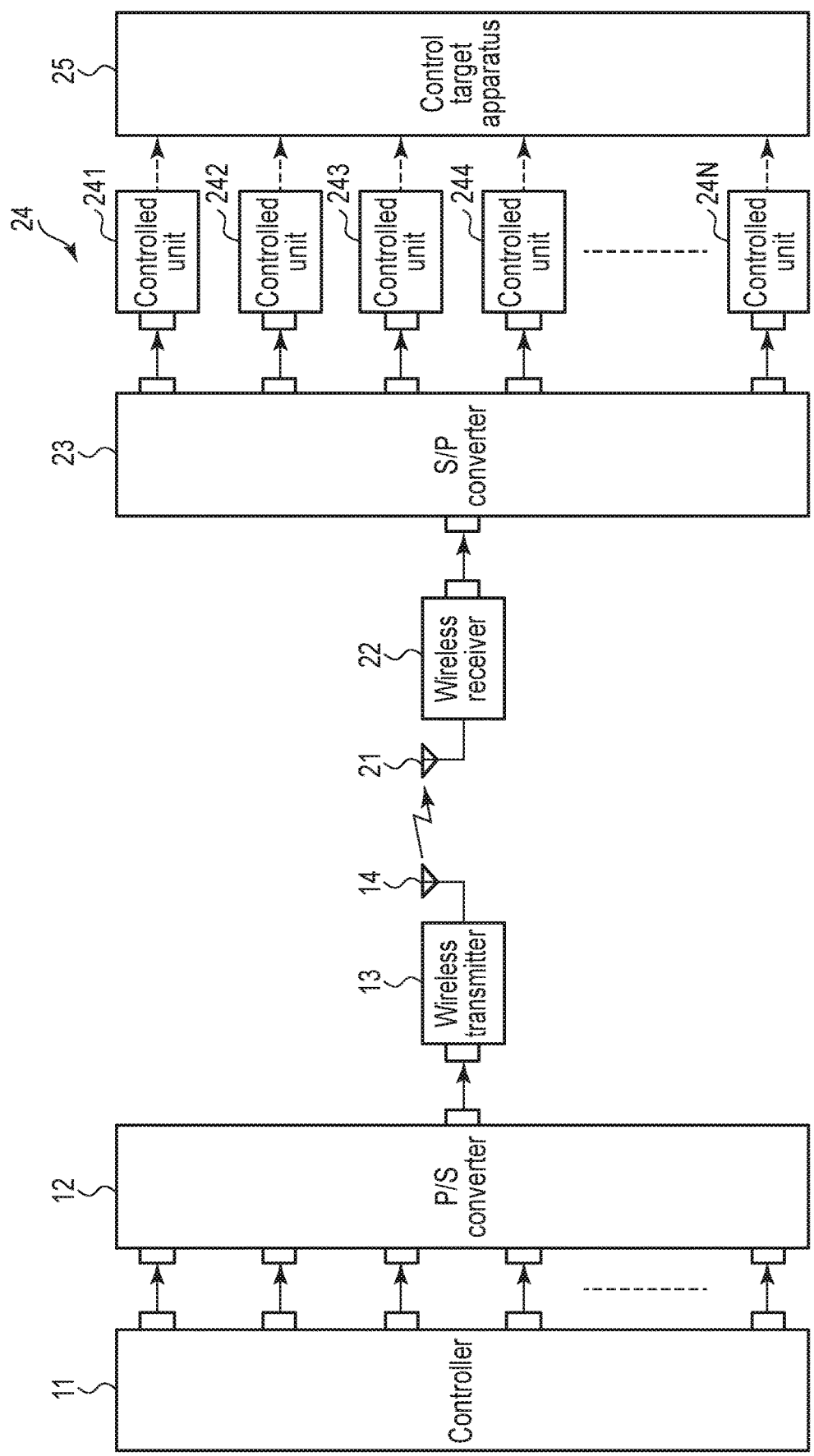
FIG. 1 is a block diagram illustrating the structure of an electronic system of a first embodiment.

FIG. 1 is a block diagram illustrating the structure of an electronic system of a first embodiment.

The electronic system of FIG. 1 can control first to Nth (N is a natural integer of two or more) controlled units 241 to 24N to control the operation of a control target apparatus 25. The control target apparatus 25 may be a motor or an inverter, and furthermore, may be a robot, railway vehicle, or train car. For example, the first to Nth (N is a natural integer of two or more) controlled units 241 to 24N are used for, for example, driving control of each phase of a motor, switching control of an inverter, multiple-joint control of a robot, and individual car control of a train.

In FIG. 1, a controller 11 generates first to Nth control signals to control the first to Nth controlled units 241 to 24N and outputs the signals in parallel. A first parallel/serial (P/S) converter 12 multiplexes the first to Nth control signals into a first serial signal. At that time, the first P/S converter 12 may multiplex a synchronization signal indicative of a position to separate the first to Nth control signals in addition to the first to Nth control signals. A first wireless transmitter 13 transmits a first serial signal on a first wireless signal in a chronologically continuous manner through a transmitter antenna 14. A first wireless receiver 22 receives the first wireless signal through a receiver antenna 21. A first serial/parallel (S/P) converter 23 separates the first to Nth control signals included in the wireless signal received by the first wireless receiver 22 and outputs the separated first to Nth control signals to the first to Nth controlled units 241 to 24N, respectively.

The first wireless transmitter 13 keeps transmitting the first wireless signal in a chronologically continuous manner during a first duration in which the first serial signal is active. Note that a state where the first serial signal is active means that the first serial signal output from the first P/S converter 12 includes a signal to control one or more controlled units.

Furthermore, the first wireless transmitter 13 is to keep transmitting the first wireless signal in a chronologically continuous manner during at least one of control periods of the first to Nth controlled unit 241 to 24N. Here, the control period of the control unit is a duration between a time when a controlled unit is once controlled and a time when the controlled unit is controlled, and may be derived by a statistical process such as averaging or a median value. For example, any duration of the control periods of the first to Nth controlled units 241 to 24N at least includes a first duration in which the first serial signal is active.

Furthermore, the first wireless transmitter 13 is to keep transmitting the wireless signal in a chronologically continuous manner in any one of durations in which controlling of the first to Nth controlled units by the first to Nth control signals starts and ends. For example, each duration in which controlling of the first to Nth controlled units by the first to Nth control signals starts and ends includes the control period of each of the first to Nth controlled units 241 to 24N.

Furthermore, if the first to Nth controlled units 241 to 24N are used to control the operation of the control target apparatus 25 such as loading, the first wireless transmitter is to keep the first wireless signal in a chronologically continuous manner during at least a duration in which controlling of the control target apparatus starts and ends. That is, keeping of transmitting the first wireless signal in a chronologically continuous manner means, basically, that the first wireless signal is kept being transmitted in a chronologically continuous manner, and there may be a time to stop the first wireless signal in a part of the duration for the purpose of, for example, abnormal detection, maintenance, or the like. For example, a duration in which controlling of the control target apparatus starts and ends includes any one of the durations in which controlling of the first to Nth controlled units 241 to 24N starts and ends.

Figure 3:
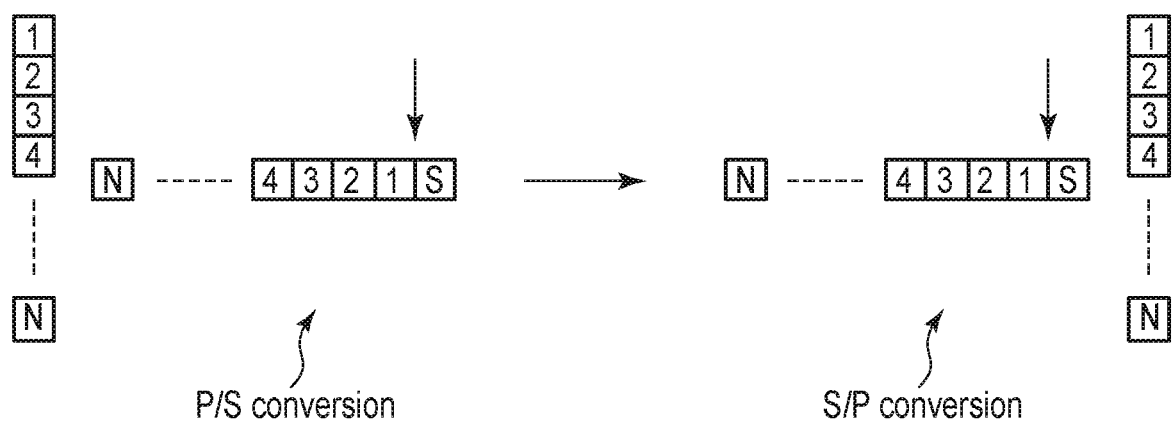
FIG. 3 is a conceptual diagram of P/S and S/P conversions of the electronic system of the first embodiment.

A process and a specific example of the above-described structure will be explained with reference to FIG. 2A, FIG. 2B and FIG. 3.

FIG. 2A and FIG. 2B are flowcharts of the process of the electronic system, in which FIG. 2A indicates a whole system process and FIG. 2B indicates a process of the controller 11. Furthermore, FIG. 3 illustrates an example in which a synchronization signal S indicative of a separation position of the first to Nth control signals is multiplexed in the P/S conversion and the S/P conversion. Note that, depending on the P/S conversion method, original bit values may be converted in accordance with a certain rule. For example, in an 8B10B conversion, 10 bit is generated with respect to an 8 bit input signal through the conversion based on a table, and are output as a serial signal. In that case, for example, the synchronization signal S may be inserted into a part of the 8 bit input signal.

In the electronic system, in the transmitter side, first to Nth control signals are generated and output in parallel as in FIG. 2A (step S11). Specifically, as in FIG. 2B, if an instruction of control start is given (step S111), the first to Nth control signals are generated (step S112), and corresponding to the control period of the first to Nth controlled units 241 to 24N (step S113), the first to Nth control signals are output in parallel (step S114), and the generation and parallel output of the control signal are repeated until an end of control is instructed (step S115).

Then, in the transmitter side of the electronic system, the first to Nth control signals are subjected to a separation synchronization process (insertion of the synchronization signal S to the serial head of the first to Nth control signals) if need be, and the P/S conversion is performed by multiplexing the first to Nth control signals output in parallel to the first serial signal (step S12), and the first serial signal is transmitted by the first wireless signal (step S13). In the receiver side, the first serial signal of the first wireless signal is received (step S14), and the received first serial signal is subjected to the S/P conversion to separate the first to Nth control signals from the first serial signal (step S15), and the separated first to Nth control signals are output to the first to Nth controlled units 241 to 24N (step S16). As above, the control target apparatus 25 is operated under the controlling of each of the first to Nth controlled units 241 to 24N (step S17).

FIG. 4 illustrates a specific example of the electronic system which is applied to the controlling of a motor driven apparatus as the control target apparatus 25. The motor driven apparatus in this example forms, with respect to a three phase motor M, a first phase current with power transistors (power semiconductor devices) Q1 and Q2, second phase current with power transistors Q3 and Q4, and third phase current with power transistors Q5 and Q6. Gate drivers G1 to G6 are connected to the gate electrodes of the power transistors Q1 to Q6, respectively. The gate drivers G1 to G6 are connected to the S/P converter 23 as controlled units 241 to 246, respectively. In the transmitter side of the electronic system, in the controller 11, first to sixth gate control signals of the gate drivers G1 to G6 (controlled units 241 to 246), respectively, are generated and output in parallel, and the P/S converter 12 multiplexes the first to sixth gate control signals into a first serial signal, and the signal is wireless transmitted from the wireless transmitter 13 via the transmitter antenna 14. In the receiver side, the wireless receiver 22 receives the first serial signal via the receiver antenna 21, and the received first serial signal is converted into a parallel signal with the S/P converter 23, and the first to sixth gate control signals are separated from the parallel signal to be output to the corresponding gate drivers G1 to G6.

With the above-described structure, the first to sixth gate control signals which are required to be synchronized can be transmitted to the gate drivers G1 to G6 while the synchronization is maintained, and thus, the motor M can be operated properly without causing shifting in the switching timings as in the packet transmission. Furthermore, low delay and high transmitting rate can be achieved at the same time, and thus, the motor M can be remotely controlled in real time.

Note that, in the electronic system of FIG. 4, the first to Nth control signals are gate control signals to drive all power transistors; however, a part of the signals may be used commonly, or may be used in other operation controlling (sensor controlling or the like).

Note that the power transistors Q1 to Q6 corresponding to the gate drivers G1 to G6, respectively, may be included in the controlled units 241 to 246, respectively.

Second Embodiment

FIG. 5 is a block diagram illustrating the structure of an electronic system of a second embodiment. In FIG. 5, elements as same as in FIG. 1 will be referred to by the same reference numbers, and explanation considered to be redundant will be omitted.

The electronic system of FIG. 5 can control first series controlled units 24A1 and 24A2 including one or more controlled units in parallel, and a second series controlled unit 24B including one or more controlled units in parallel, and further includes a receiver antenna 21B, second wireless receiver 22B, and second S/P converter 23B.

The controller 11 generates first to third unit control signals to control the first series controlled units 24A1 and 24A2, and the second series controlled unit 24B. The first P/S converter 12 multiplexes first to third unit control signals to a first serial signal. The first wireless transmitter 13 transmits the first serial signal in a chronologically continuous manner by a first wireless signal to the first wireless receiver 22A and the second wireless receiver 22B.

The first wireless receiver 22A receives the first wireless signal via the receiver antenna 21A. The first S/P converter 23A separates the first and second unit control signals included in the first wireless signal received by the first wireless receiver 22A, and outputs the separated signals to the first series controlled units 24A1 and 24A2. The second wireless receiver 22B receives the first wireless signal via the receiver antenna 21B. The second S/P converter 23B separates the third unit control signal included in the first wireless signal received by the second wireless receiver 22B and outputs the separated signal to the second series third controlled unit 24B.

With the above structure, even if controlled units are controlled in synchronization in different series, control signals are multiplexed into one serial signal to each series, and the control signal can be separately output in the receiver side. Thus, the individual controlling of the controlled units can be performed properly with low delay and high transmitting rate while the synchronization is maintained.

Third Embodiment

FIG. 6 is a block diagram illustrating the structure of an electronic system of a third embodiment. In FIG. 6, elements as same as in FIG. 1 will be referred to by the same reference numbers, and explanation considered to be redundant will be omitted.

The electronic system of FIG. 6 can control controlled units 24B1 and 24B2 in two series.

In the transmitter side, a controller 11 generates a fourth unit control signal which is different from a third unit control signal to control controlled units 24B1 and 24B2. A first P/S converter 12 multiplexes first to fourth unit control signals into a first serial signal. In the receiver side, a second S/P converter 22B separates the third and fourth unit control signals included in the first wireless signal received by the second wireless receiver 21B, outputs the third unit control signal to the controlled unit 24B1 and the fourth unit control signal to the controlled unit 24B2.

With the above structure, even if controlled units are controlled individually in synchronization in the same series, unit control signals are multiplexed into one serial signal in each series, and the unit control signal can be separately output in the receiver side. Thus, the individual controlling of the controlled units can be performed properly with low delay and high transmitting rate while the synchronization is maintained.

Fourth Embodiment

FIG. 7 is a block diagram illustrating the structure of an electronic system of a fourth embodiment. In FIG. 7, same elements as in FIGS. 5 and 6 are referred to by the same reference numbers, and explanation considered to be redundant will be omitted.

The electronic system of FIG. 7 commonly controls the second series controlled units 24B1 and 24B2 with a third unit control signal. That is, in the transmitter side, a controller 11 generates a third unit control signal to commonly control the controlled unit 24B1 and 24B2. A first P/S converter 12 multiplexes first to third unit control signals into a first serial signal. In the receiver side, a second S/P converter 22B separates a third unit control signal included in a first wireless signal received by the second wireless receiver 21B, and outputs the third unit control signal to both the controlled units 24B1 and 24B2.

With the above structure, even if controlled units are controlled commonly in synchronization in the same series, common unit control signal is multiplexed into one serial signal in the series, and the common unit control signal can be separately output to the controlled units in the series in the receiver side. Thus, the individual controlling of the commonly operating controlled units can be performed properly with low delay and high transmitting rate while the synchronization is maintained.

Fifth Embodiment

FIG. 8 is a block diagram illustrating the structure of an electronic system of a fifth embodiment. In FIG. 8, same elements as in FIGS. 1 and 5 to 7 are referred to by the same reference numbers, and explanation considered to be redundant will be omitted.

The electronic system of FIG. 8 transmits a first series unit control signal and a second series unit control signal by different wireless signals.

In FIG. 8, in the transmitter side, first unit control signal and second unit control signal of the first series output in parallel from the controller 11 are multiplexed into the first serial signal in the first P/S converter 12A, and are transmitted from the first wireless transmitter 13A in a chronologically continuous manner by the first wireless signal through a first transmitter antenna 14A. Furthermore, third and fourth unit control signals of the second series output in parallel from the controller 11 are multiplexed into a second serial signal which is synchronized with the first serial signal with a second P/S converter, and are transmitted in a chronologically continuous manner by the second wireless signal from the second wireless transmitter 13B through a second transmitter antenna 14B.

In the receiver side, a first wireless receiver 22A acquires a first serial signal by receiving the first wireless signal through the first receiver antenna 21A. A first S/P converter 23A separates first and second unit control signals from the first serial signal and outputs the signals to controlled units 12A1 and 12A2, respectively. On the other hand, a second wireless receiver 22B acquires a second serial signal by receiving the second wireless signal through the second receiver antenna 21B. A second S/P converter 23B separates third and fourth unit control signals from the second serial signal and outputs the signals to controlled units 12B1 and 12B2, respectively.

In the above-described structure, a first frequency bandwidth in which the first wireless transmitter 13A transmits the first wireless signal is different from a second frequency bandwidth in which the second wireless transmitter 13B transmits the second wireless signal. Thus, a transmission error caused by mixture of the first and second wireless signals can be prevented.

With the above-described structure, even if the number of input control signals of one P/S converter is limited, the synchronization control of controlled units of control signals which are above the number of input control signals of one P/S converter can be performed.

Furthermore, even if the first series and the second series in the receiver side are physically distant, and the transmission cannot be performed with a single wireless transmitter, there can be provided two wireless transmitters which correspond to the first and second series in order to perform the synchronization control of several series.

Sixth Embodiment

Figure 9:
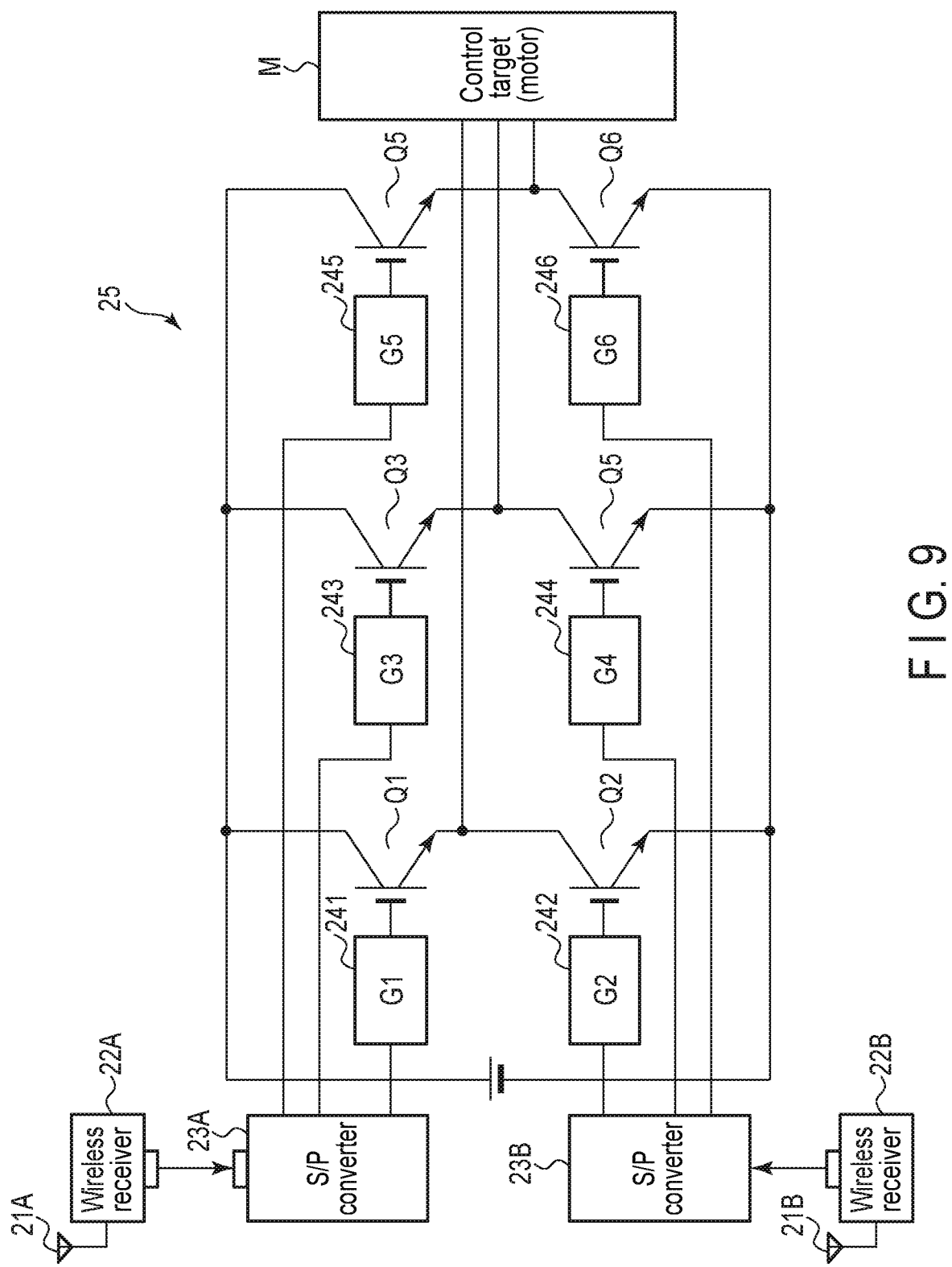
FIG. 9 is a block diagram of the structure of an electronic system of a sixth embodiment, in which a motor-driven apparatus is implemented as a control target apparatus.

FIG. 9 is a block diagram of a specific example of the electronic system of a sixth embodiment, in which a motor driven apparatus is a control target apparatus. In FIG. 8, same elements as in FIGS. 1 to 8 are referred to by the same reference numbers, and explanation considered to be redundant will be omitted.

In the example of FIG. 4, in the transmitter side, first to sixth gate control signals multiplexed in a first serial signal are transmitted by the first wireless signal, the first serial signal is received in the receiver side by receiving the first wireless signal, and the first serial signal is converted into a parallel signal to separate the first to sixth gate control signals. In contrast, in the example of FIG. 9, as in the second embodiment, the receiver side is divided into a first series and a second series, a first serial signal s acquired by receiving the first wireless signal by the receiver antenna 21A and the wireless receiver 22A of the first series, and the first serial signal is converted into a parallel signal with the S/P converter 23A to separate the first, third, and fifth gate control signals to be output to the first, third, and fifth gate drivers G1, G3, and G5, respectively. Furthermore, the first serial signal is acquired by receiving the first wireless signal with the receiver antenna 21B and wireless receiver 22B of the second series, and the first serial signal is converted by the S/P converter 23B into a parallel signal to separate second, fourth, and sixth gate control signals to be output to the second, fourth, and sixth gate drivers G2, G4, and G6, respectively. With this structure, the synchronization control of each of the power transistors Q1 to Q6 can be performed.

Furthermore, in the structure of FIG. 9, as in the fifth embodiment, the transmitter side and the receiver side may be divided into two series. In the transmitter side, first, third, and fifth gate control signals are multiplexed into a first serial signal to be transmitted on a first wireless signal, and second, fourth, and sixth gate control signals are multiplexed into a second serial signal to be transmitted on a second wireless signal, and in the receiver side, a first serial signal is acquired by receiving the first wireless signal with the receiver antenna 21A, wireless receiver 22A, and S/P converter 23A of the first series, and the first, third, and fifth gate control signals are separated from the first serial signal to be output to the first, third, and fifth gate drivers G1, G3, and G5, respectively. Furthermore, a second serial signal is acquired by receiving the receiver antenna 21B, wireless receiver 22B, and S/P converter 23B of the second series, and the second, fourth, and sixth gate control signals are separated from the second serial signal to be output to the second, fourth, sixth gate drivers G2, G4, and G6, respectively. With this structure, the synchronization control of the power transistors Q1 to Q6 can be performed.

Furthermore, in the above-described example, each gate control signal is processed in two series; however, the signal may be processed in three or more series, or all gate control signals may be processed in a series.

Furthermore, in each of the above-mentioned embodiment, the operation of one control target apparatus is controlled by controlled units; however, the operation of several control target apparatus may be controlled by optional controlled units.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic system comprising:
a controller configured to generate a first control signal to control a first controlled unit and a second control signal to control a second controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal; and
a first parallel converter configured to separate the first control signal and the second control signal from the first wireless signal received by the first wireless receiver, to output the first control signal to the first controlled unit, and to output the second control signal to the second controlled unit,
wherein:
the first controlled unit and the second controlled unit are used to control operations of a control target apparatus, and
the first wireless transmitter transmits the first wireless signal in a chronologically continuous manner at least during a duration in which control of the control target apparatus starts and ends.

2. An electronic system comprising:
a controller configured to generate a first control signal to control a first controlled unit and a second control signal to control a second controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal;
a first parallel converter configured to separate the first control signal from the first wireless signal received by the first wireless receiver, and to output the first control signal to the first controlled unit;
a second wireless receiver configured to receive the first wireless signal; and
a second parallel converter configured to separate the second control signal from the first wireless signal received by the second wireless receiver, and to output the second control signal to the second controlled unit.

3. An electronic system comprising:
a controller configured to generate a first control signal to control a first controlled unit, a second control signal to control a second controlled unit, and a third control signal to control a third controlled unit;
a first serial converter configured to multiplex the first control signal, the second control signal, and the third control signal into a first serial signal;
a first wireless transmitter configured to transmit the first serial signal by a first wireless signal in a chronologically continuous manner;
a first wireless receiver configured to receive the first wireless signal;
a first parallel converter configured to separate the first control signal and the second control signal from the first wireless signal received by the first wireless receiver, to output the first control signal to the first controlled unit, and to output the second control signal to the second controlled unit;
a second wireless receiver configured to receive the first wireless signal; and
a second parallel converter configured to separate the third control signal from the first wireless signal received by the second wireless receiver, and to output the third control signal to the third controlled unit.

4. The electronic system of claim 3, wherein:
the controller further generates a fourth control signal which is different from the third control signal to control a fourth controlled unit,
the first serial converter multiplexes the first, second, third, and fourth control signals into the first serial signal, and
the second parallel converter separates the third control signal and the fourth control signal from the first wireless signal received by the second wireless receiver, and outputs the third control signal to the third controlled unit and the fourth control signal to the fourth controlled unit.

5. The electronic system of claim 3, wherein:
the third control signal is used to control the third controlled unit and the fourth controlled unit, and
the second parallel converter separates the third control signal from the first wireless signal received by the second wireless receiver, and outputs the third control signal to the third controlled unit and the fourth controlled unit.

6. An electronic system comprising:
a controller configured to generate a first control signal to control a first controlled unit, a second control signal to control a second controlled unit, a fifth control signal to control a fifth controlled unit, and a sixth control signal to control a sixth controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal;
a first parallel converter configured to separate the first control signal and the second control signal from the first wireless signal received by the first wireless receiver, to output the first control signal to the first controlled unit, and to output the second control signal to the second controlled unit;
a second serial converter configured to multiplex the fifth control signal and the sixth control signal into a second serial signal synchronized with the first serial signal;
a second wireless transmitter configured to transmit the second serial signal by a second wireless signal in a chronologically continuous manner;
a third wireless receiver configured to receive the second wireless signal; and
a third parallel converter configured to separate the fifth control signal and the sixth control signal from the second wireless signal received by the wireless receiver, to output the fifth control signal to the fifth controlled unit, and to output the sixth control signal to the sixth controlled unit.

7. The electronic system of claim 6, wherein a first frequency band through which the first wireless transmitter transmits the first wireless signal is different from a second frequency band through which the second wireless transmitter transmits the second wireless signal.

8. A electronic system comprising:
a controller configured to generate a first control signal to control a first controlled unit and a second control signal to control a second controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal; and
a first parallel converter configured to separate the first control signal and the second control signal from the first wireless signal received by the first wireless receiver, to output the first control signal to the first controlled unit, and to output the second control signal to the second controlled unit,
wherein the first controlled unit and the second controlled unit are electronic components functioning in synchronization with each other.

9. A electronic system comprising:
a controller configured to generate a first control signal to control a first controlled unit and a second control signal to control a second controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal;
a first parallel converter configured to separate the first control signal and the second control signal from the first wireless signal received by the first wireless receiver, to output the first control signal to the first controlled unit, and to output the second control signal to the second controlled unit; and
a control target apparatus configured to be controlled by the first controlled unit and the second controlled unit.

10. An electronic system comprising:
a controller configured to generate a first control signal to control a first controlled unit and a second control signal to control a second controlled unit;
a first serial converter configured to multiplex the first control signal and the second control signal into a first serial signal;
a first wireless transmitter configured to transmit the first serial signal by a first wireless signal in a chronologically continuous manner;
a first wireless receiver configured to receive the first wireless signal; and
a first parallel converter configured to separate the first control signal and the second control signal from the first wireless signal received by the first wireless receiver, to output the first control signal to the first controlled unit, and to output the second control signal to the second controlled unit,
wherein the first serial converter multiplexes the first control signal, the second control signal, and a synchronization signal indicating a position of separation between the first control signal and second control signal to separate the first control signal and second control signal into the first serial signal.

11. An electronic system comprising:

a controller configured to generate a first control signal to control a first controlled unit and a second control signal to control a second controlled unit;

a first serial converter configured to multiplex the first control signal and the second control signal into a first serial signal;

a first wireless transmitter configured to transmit the first serial signal by a first wireless signal in a chronologically continuous manner;

a first wireless receiver configured to receive the first wireless signal; and a first parallel converter configured to separate the first control signal and the second control signal from the first wireless signal received by the first wireless receiver, to output the first control signal to the first controlled unit, and to output the second control signal to the second controlled unit, wherein:

at least one of the first control signal and the second control signal includes a signal to generate a gate signal to drive a power semiconductor device, and at least one of the first and second controlled units includes a driver of the power semiconductor device or the power semiconductor device.

12. A method comprising:

generating a first control signal to control a first controlled unit and a second control signal to control a second controlled unit;

multiplexing the first control signal and the second control signal into a first serial signal;

transmitting the first serial signal by a first wireless signal in a chronologically continuous manner;

receiving the first wireless signal; and separating the first control signal and the second control signal from the first wireless signal to output the first control signal to the first controlled unit and the second control signal to the second controlled unit, wherein:

the first controlled unit and the second controlled unit are used in controlling of operations of a control target apparatus, and transmitting of the first wireless signal in a chronologically continuous manner is kept during at least a duration in which controlling of the control target apparatus starts and ends.

* * * * *